(12) United States Patent
Palandech et al.

(10) Patent No.: US 8,199,457 B1
(45) Date of Patent: Jun. 12, 2012

(54) MICROFABRICATED RF CAPACITOR

(75) Inventors: Robert L. Palandech, Marion, IA (US);
Nathan P. Lower, North Liberty, IA (US); Mark M. Mulbrook, Marion, IA (US); Nathaniel P. Wyckoff, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 137 days.

(21) Appl. No.: 12/856,748

(22) Filed: Aug. 16, 2010

(51) Int. Cl.
*H01G 4/06* (2006.01)

(52) U.S. Cl. .................. 361/311; 361/301.2; 361/301.4; 361/313; 361/306.1; 361/306.3

(58) Field of Classification Search .................. 361/311, 361/301.2, 301.4, 312–313, 306.1, 306.3, 361/321.2

See application file for complete search history.

(56) References Cited

U.S. PATENT DOCUMENTS

| | | | |
|---|---|---|---|
| 6,208,500 B1 * | 3/2001 | Alexander et al. | 361/303 |
| 6,542,351 B1 * | 4/2003 | Kwang | 361/303 |
| 6,653,681 B2 * | 11/2003 | Appel | 257/307 |
| 6,737,698 B1 * | 5/2004 | Paul et al. | 257/306 |
| 7,009,832 B1 * | 3/2006 | Chen et al. | 361/306.1 |
| 7,656,643 B2 * | 2/2010 | Fong et al. | 361/306.2 |

* cited by examiner

*Primary Examiner* — Nguyen T Ha
(74) *Attorney, Agent, or Firm* — Donna P. Suchy; Daniel M. Barbieri

(57) ABSTRACT

The present invention is directed to a microfabricated RF capacitor. The capacitor includes two signal wirebond pads configured for being connected to an electrical current source. The capacitor further includes two backbone structures which are connected to the wirebond pads and receive electrical current from the electrical current source via the wirebond pads, each backbone structure including a first backbone portion and a second backbone portion. The capacitor further includes a plurality of protrusions which are connected to the backbone portions of the backbone structures. The protrusions are spaced apart from each other and parallel to each other. Further, the protrusions are configured for distributing current received by the backbone structures and for promoting structural stability of the capacitor. The capacitor further includes a ground wall structure which may be configured for receiving ground current from a ground current source.

20 Claims, 2 Drawing Sheets

MICROFABRICATED RF CAPACITOR

FIELD OF THE INVENTION

The present invention relates to the field of advanced radio systems, and more particularly, to a microfabricated Radio Frequency (RF) capacitor.

BACKGROUND OF THE INVENTION

Currently available RF capacitors may not provide a desired level of performance, may have a larger-than-desired footprint and/or may not be cost effective. For example, one type of currently available RF capacitor is the metal-insulator-metal capacitor (MIMCAP). One drawback with MIMCAPs is that they are relatively expensive to assemble compared to other currently available RF capacitors. A further drawback with MIMCAPs is that they occupy a large footprint relative to other currently available RF capacitors. Another type of currently available RF capacitor is the ceramic capacitor (ex.—interdigitated ceramic capacitor). Ceramic materials which may be implemented in these currently available ceramic capacitors in order to provide high density (ex.—high capacitance per unit of area) may include Barium Titanate and Strontium Titanate. However, ceramic capacitors may not provide a desired level of performance, may have a larger-than-desired footprint and/or may not be cost effective. For example, in RF passive networks for which radio communication performance is limited by a loss of energy in a passive component, a ceramic capacitor may limit the performance of the passive network.

Thus, it would be desirable to have a microfabricated passive component (ex.—capacitor) for RF frequency applications which may provide improved energy loss performance, may have a smaller footprint, and/or may be more cost-effective compared to currently available solutions.

SUMMARY OF THE INVENTION

Accordingly an embodiment of the present invention is directed to a capacitor, including: a first signal wirebond pad and a second signal wirebond pad, the wirebond pads each configured for being connected to an electrical current source; a first backbone structure and a second backbone structure, the first backbone structure being connected to the first signal wirebond pad, the second backbone structure being connected to the second signal wirebond pad, the backbone structures being configured for receiving electrical current from the electrical current source via the wirebond pads, each backbone structure including a first backbone portion and a second backbone portion; a plurality of protrusions, said plurality of protrusions being connected to the backbone portions of the backbone structures, said protrusions being configured for distributing current received by the backbone structures and for promoting structural stability of the capacitor; and a ground wall structure, the ground wall structure configured for being connected to a ground current source, the ground wall structure further configured for receiving ground current from the ground current source.

A further embodiment of the present invention is directed to a microfabricated Radio Frequency (RF) structure, including: a substrate; and a capacitor, said capacitor being connected to a surface of said substrate, said capacitor including: a first signal wirebond pad and a second signal wirebond pad, the wirebond pads each configured for being connected to an electrical current source; a first backbone structure and a second backbone structure, the first backbone structure being connected to the first signal wirebond pad, the second backbone structure being connected to the second signal wirebond pad, the backbone structures being configured for receiving electrical current from the electrical current source via the wirebond pads, each backbone structure including a first backbone portion and a second backbone portion; a plurality of protrusions, said plurality of protrusions being connected to the backbone portions of the backbone structures, said protrusions being configured for distributing current received by the backbone structures and for promoting structural stability of the capacitor; and a ground wall structure, the ground wall structure configured for being connected to a ground current source, the ground wall structure further configured for receiving ground current from the ground current source.

A still further embodiment of the present invention is directed to a capacitor, including: a first signal wirebond pad and a second signal wirebond pad, the wirebond pads each configured for being connected to an electrical current source; a first backbone structure and a second backbone structure, the first backbone structure being connected to the first signal wirebond pad, the second backbone structure being connected to the second signal wirebond pad, the backbone structures being configured for receiving electrical current from the electrical current source via the wirebond pads, each backbone structure including a first backbone portion and a second backbone portion; a plurality of wall-shaped protrusions, said plurality of protrusions being connected to the backbone portions of the backbone structures, said protrusions being configured for distributing current received by the backbone structures, a first protrusion included in the plurality of protrusions is connected to the first backbone structure and extends toward the second backbone structure, while a second protrusion included in the plurality of protrusions is connected to the second backbone structure and extends toward the first backbone structure, the first protrusion being configured in a parallel orientation relative to the second protrusion, thereby forming a gap between the first protrusion and the second protrusion; and a ground wall structure, the ground wall structure configured for being connected to a ground current source, the ground wall structure further configured for receiving ground current from the ground current source. The ground current source may be separated from the ground wall structure by a planar microwave transmission structure. A planar microwave transmission structure which supports a power wave to the present invention may be a coplanar waveguide.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Capacitors and inductors are fundamental building blocks in a number of products, such as bandpass filters, harmonic rejection low pass filters and Radio Frequency (RF) chokes. Any one of a number of processes may be utilized to integrate the active circuitry required for receiver, transmitter, power amplifier (PA) and/or modem functionality. Said active circuitry may include heterojunction bipolar transistors (HBT), Silicon Germanium (SiGe) semiconductors, pseudomorphic high electron mobility transistors (PHEMT), metamorphic high electron mobility transistors (MHEMT), complementary metal-oxide-semiconductors (CMOS), laterally diffused metal-oxide-semiconductors (LDMOS) and/or the like. Currently available filtering components occupy a major portion of existing board area (ex.—use large amounts of area in device interconnect). Further, currently available purchased lumped devices may include end plated interconnects which require a solder area and an interconnect area. Still further, currently available purchased lumped devices do not provide a path to integration with active devices. For example, a number of currently available filter devices (ex.—filtering components) are achieved with ceramic resonators, Bulk Acoustic Wave (BAW) devices, and Semiconductor Acoustic Wave (SAW) devices. However, ceramic filters are very large, while BAW and SAW devices have limited power handling capability. Further, SAW devices provide poor ultimate rejection at RF frequencies an octave or more higher than passband of the SAW device.

In the exemplary embodiments of the present invention disclosed herein, a microfabricated RF capacitor is described which addresses the above-referenced shortcomings of currently available components and/or passive devices.

Figure 1:
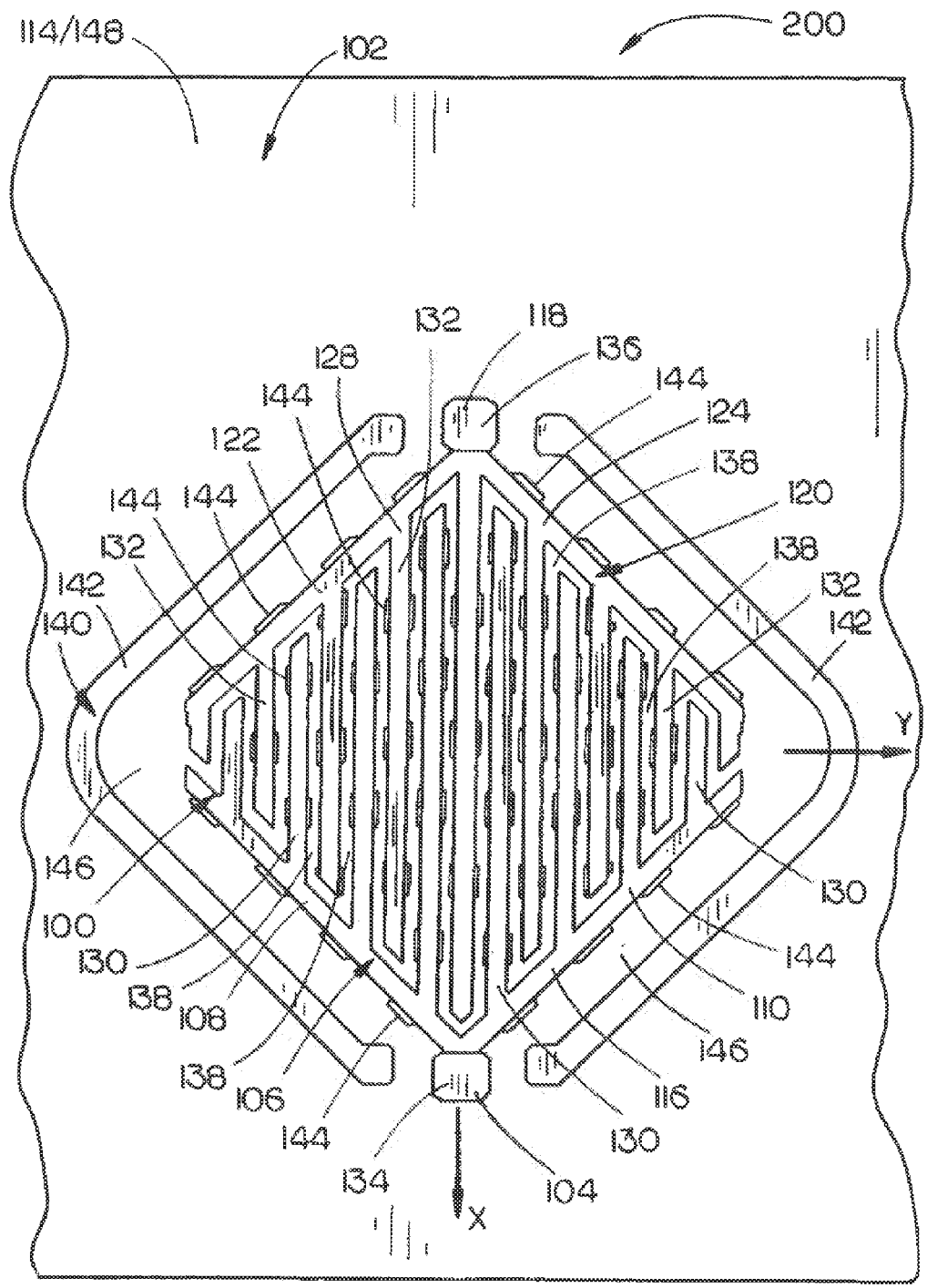
FIG. 1 is a top plan view of a microfabricated RF structure, the microfabricated RF structure including a microfabricated RF capacitor connected to a substrate in accordance with an exemplary embodiment of the present invention.
Figure 2:
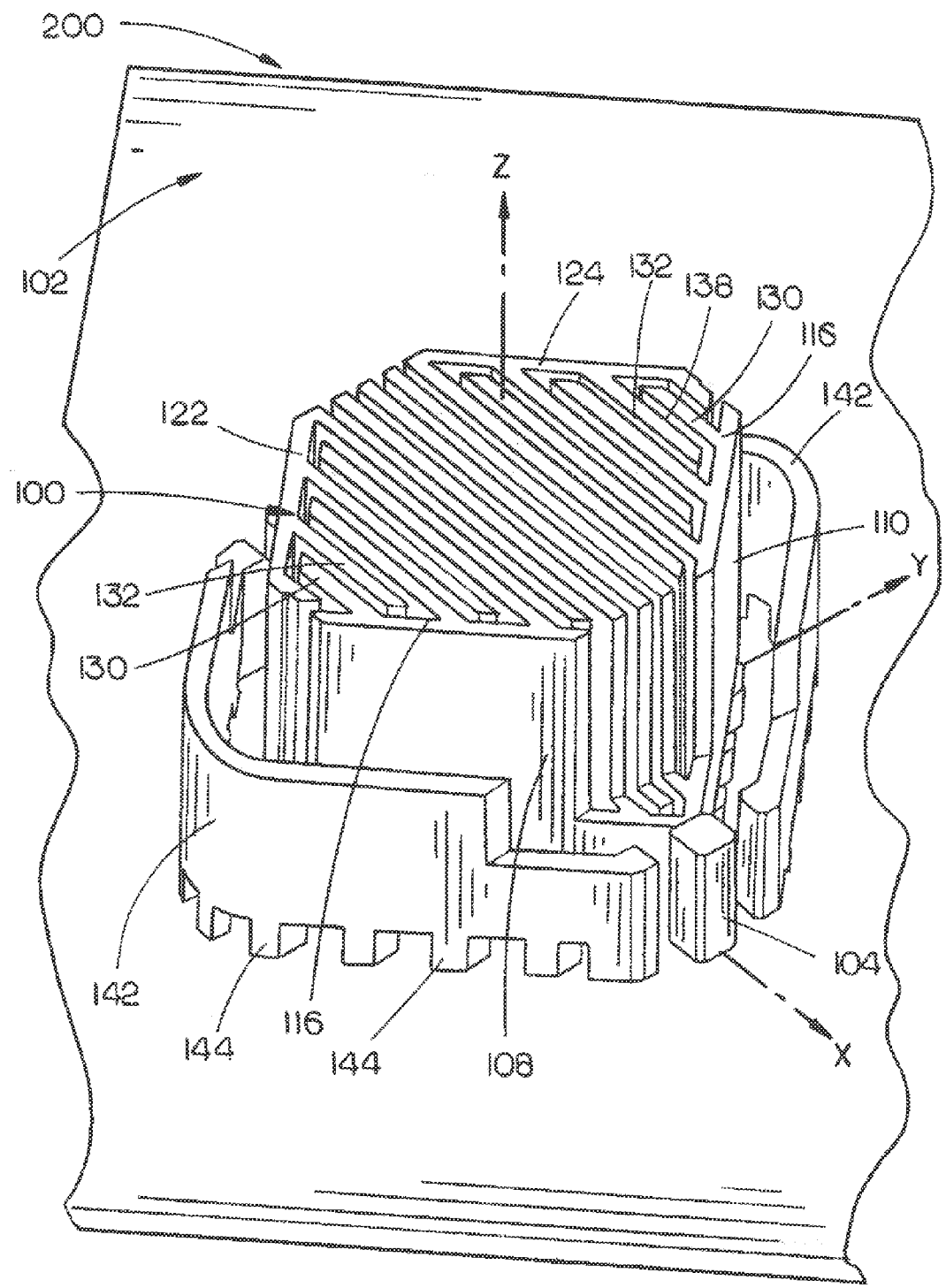
FIG. 2 is an isometric view of the microfabricated RF structure shown in FIG. 1 in accordance with an exemplary embodiment of the present invention.

Referring to FIGS. 1 and 2, a microfabricated RF capacitor in accordance with an exemplary embodiment of the present invention is shown. The microfabricated RF capacitor 100 may be a three-dimensional component and may be a passive component (exs.—a passive electrical component, a passive electronic component, a passive filter component). In exemplary embodiments of the present invention, the microfabricated RF capacitor 100 may be configured for being connected to (exs.—mounted upon, formed upon, bonded to) a substrate 102, such as a silicon wafer, to form a microfabricated RF structure 200 (ex.—an RF filter structure). In exemplary embodiments of the present invention, the microfabricated RF capacitor 100 may include a signal wirebond pad 104. In further embodiments of the present invention, the signal wirebond pad 104 may be configured for being connected to an electrical current source. In still further embodiments of the present invention, the signal wirebond pad 104 may be further configured for receiving electrical current from the electrical current source.

In current exemplary embodiments of the present invention, the microfabricated RF capacitor 100 may include a backbone structure 106. In further embodiments of the present invention, the backbone structure 106 may be configured for being connected to the signal wirebond pad 104. In still further embodiments of the present invention, the backbone structure 106 may include a first backbone portion 108 and a second backbone portion 110. In further embodiments of the present invention, the first backbone portion 108 may be connected to the second backbone portion 110, such that the first backbone portion 108 and the second backbone portion 110 form a V-shaped backbone structure 106, as shown in FIG. 1. In still further embodiments of the present invention, each of the first backbone portion 108 and the second backbone portion 110 of the first backbone structure 106 may be configured as walls which longitudinally extend in a plane which is perpendicular to a top surface 114 (ex.—surface oriented toward the capacitor 100) of the substrate 102 (as shown in FIG. 2). For example, each of the first backbone portion 108 and the second backbone portion 110 of the first backbone structure 106 may include a top surface (oriented away from or facing away from the substrate), a bottom surface generally opposite the top surface (said bottom surface being oriented towards or facing towards the substrate), an inner wall surface (oriented towards or facing towards a second backbone structure 120), and an outer wall surface (oriented away from or facing away from the second backbone structure 120).

In exemplary embodiments of the present invention, the backbone structure 106 may be connected to the signal wirebond pad 104 at a junction point of the first backbone portion 108 and the second backbone portion 110 (ex.—at or proximal to a point or location where the first backbone portion 108 meets or connects with the second backbone portion 110). In further embodiments of the present invention, the signal wirebond pad 104 is configured for directing the received electrical current from the signal wirebond pad 104 to the backbone structure 106.

In current exemplary embodiments of the present invention, when the microfabricated RF capacitor 100 is connected to the substrate 102, the signal wirebond pad 104 may be configured such that said signal wirebond pad 104 is spaced or distanced from the substrate 102 at a height above the substrate 102. In still further embodiments of the present invention, the capacitor 100 may be configured so that the received electrical current flows from the signal wirebond pad 104 into the backbone structure 106 at or below a height location on the backbone structure 106. In further embodiments of the present invention, the distance between the height location and a top surface 116 (ex.—surface oriented away from the substrate 102) of the backbone structure 106 being a same distance as the height at which the signal wirebond pad 104 is located (or spaced) above the substrate 102.

In exemplary embodiments of the present invention, the microfabricated RF capacitor 100 may further include a second signal wirebond pad 118. In further embodiments of the present invention, the second signal wirebond pad 118 may be configured for being connected to an electrical current source. In still further embodiments of the present invention, the second signal wirebond pad 118 may be further configured for receiving electrical current from the electrical current source.

In current exemplary embodiments of the present invention, the microfabricated RF capacitor 100 may include a second backbone structure 120. In further embodiments of the present invention, the second backbone structure 120 may be configured for being connected to the second signal wirebond pad 118. In still further embodiments of the present invention, the second backbone structure 120 may include a first backbone portion 122 and a second backbone portion 124. In further embodiments of the present invention, the first backbone portion 122 may be connected to the second backbone portion 124, such that the first backbone portion 122 and the second backbone portion 124 form a V-shaped backbone structure 120, as shown in FIG. 1. In still further embodiments of the present invention, each of the first backbone portion 122 and the second backbone portion 124 of the second backbone structure 120 may be configured as walls which longitudinally extend in a plane which is perpendicular to the top surface 114 of the substrate 102. (as shown in FIG. 2). For example, each of the first backbone portion 122 and the second backbone portion 124 of the second backbone structure 120 may include a top surface (oriented away from or facing away from the substrate), a bottom surface generally opposite the top surface (said bottom surface being oriented towards or facing towards the substrate), an inner wall surface (oriented towards or facing towards a first backbone structure 106), and an outer wall surface (oriented away from or facing away from the first backbone structure 106).

In exemplary embodiments of the present invention, the second backbone structure 120 may be connected to the second signal wirebond pad 118 at a junction point of the first backbone portion 122 and the second backbone portion 124 (ex.—at or proximal to a point or location where the first backbone portion 122 meets or connects with the second backbone portion 124). In further embodiments of the present invention, the second signal wirebond pad 118 is configured for directing the received electrical current from the second signal wirebond pad 118 to the second backbone structure 120.

In current exemplary embodiments of the present invention, when the microfabricated RF capacitor 100 is connected to the substrate 102, the second signal wirebond pad 118 may be configured such that said second signal wirebond pad 118 is spaced or distanced from the substrate 102 at a height above the substrate 102. In still further embodiments of the present invention, the capacitor 100 may be configured so that the received electrical current flows from the second signal wirebond pad 118 into the second backbone structure 120 at or below a height location on the second backbone structure 120. In further embodiments of the present invention, the distance between the height location on the second backbone structure 120 and a top surface 128 (ex.—surface oriented away from the substrate 102) of the second backbone structure 120 being a same distance as the height at which the second signal wirebond pad 118 is located (or spaced) above the substrate 102.

In exemplary embodiments of the present invention, a boundary condition for a time-varying electric field at or near the top surfaces (116, 128) of the backbone structures (106, 120) may tend to force a minimum of current along (ex.—parallel to) the z-axis near the top surfaces (116, 128) of the backbone structures (106, 120) (ex.—the z-axis may be a vertically extending axis which is perpendicular to the top surfaces (116, 128) of the backbone structures (106, 120), as shown in FIGS. 1 and 2). Thus, charge density may be lower in the regions near (ex.—8 to 10 mils below (or $8/1000$ to $10/1000$ of an inch below) the top surfaces (116, 128) of the backbone structures (106, 120).

In current exemplary embodiments of the present invention, the microfabricated RF capacitor 100 may be configured as a generally square-shaped or generally diamond-shaped component, as shown in FIG. 1. In further embodiments, the first signal wirebond pad 104 and the second signal wirebond pad 118 may be configured at opposite ends or corners of the capacitor 100, as shown in FIG. 1. In still further embodiments of the present invention, the capacitor 100 may include a first plurality of digits 130 and a second plurality of digits 132. In further embodiments of the present invention, the first plurality of digits 130 may be connected to the first backbone structure 106, while the second plurality of digits 132 may be connected to the second backbone structure 120. For example, each digit included in the first plurality of digits 130 may be configured as a protrusion or wall having a first end and a second end, the first end being connected to the first backbone structure 106, the digit extending horizontally (ex.—in a plane parallel to the x-axis) towards the second backbone structure 120, such that the second end is directed towards or oriented towards the second backbone structure 120. Further, each digit included in the first plurality of digits 130 may also be a vertical digit which extends vertically (ex.—in a plane parallel to the z-axis). Further, each digit included in the second plurality of digits 132 may be configured as a protrusion or wall having a first end and a second end, the first end being connected to the second backbone structure 120, the digit further extending horizontally (ex.—in a plane parallel to the x-axis) towards the first backbone structure 120 such that the second end is directed towards or oriented towards the first backbone structure 120. Further each digit included in the second plurality of digits 132 may be also be a vertical digit which extends vertically (ex.—in a plane parallel to the z-axis).

As mentioned above, the first backbone structure 106 and the second backbone structure 120 may each be configured as a V-shaped structure (as shown in FIG. 1). For example, the first backbone portion 108 and the second backbone portion 110 of the first backbone structure 106 may each connect to the first signal wirebond pad 104 at a 45-degree angle or at approximately a 45-degree angle relative to a plane which is parallel to the z-axis and is perpendicular to a top surface 134 (ex.—a surface oriented away from the substrate 102) of the first signal wirebond pad 104. Further, the first backbone portion 122 and the second backbone portion 124 of the second backbone structure 120 may each connect to the second signal wirebond pad 118 at a 45-degree angle or at approximately a 45-degree angle relative to a plane which is parallel to the z-axis and is perpendicular to a top surface 136 (ex.—a surface oriented away from the substrate 102) of the second signal wirebond pad 118.

In exemplary embodiments of the present invention, each of the digits included in the first plurality of digits 130 which are connected to the first backbone portion 108 of the first backbone structure 106 may be configured on the first backbone structure 106 such that said digits are spaced evenly relative to each other. Further, at least two of the digits included in the first plurality of digits 130 which connect with the first backbone structure 106 connect with the first backbone portion 108 at a same angle (ex.—45 degrees) relative to the inner wall surface of the first backbone portion 108 (as shown in FIG. 2). Further, each of the digits included in the first plurality of digits 130 which are connected to the second backbone portion 110 of the first backbone structure 106 may be configured on the first backbone structure 106 such that said digits are spaced evenly relative to each other. Further, at least two of the digits included in the first plurality of digits which connect with the first backbone structure 106 connect with the second backbone portion 110 at a same angle (ex.—45 degrees) relative to the inner wall surface of the second backbone portion 110.

In further embodiments of the present invention, each of the digits included in the second plurality of digits 132 which are connected to the first backbone portion 122 of the second backbone structure 120 may be configured on the second backbone structure 120 such that said digits are spaced evenly relative to each other. Further, at least two of the digits included in the second plurality of digits 132 which connect with the second backbone structure 120 connect with the first backbone portion 122 at a same angle (ex.—45 degrees) relative to the inner wall surface of the first backbone portion 122. Further, each of the digits included in the second plurality of digits 132 which are connected to the second backbone portion 124 of the second backbone structure 120 may be configured on the second backbone structure 120 such that said digits are spaced evenly relative to each other. Further, at least two of the digits included in the second plurality of digits 132 which connect with the second backbone structure 120 connect with the second backbone portion 124 at a same angle (ex.—45 degrees) relative to the inner wall surface of the second backbone portion 124.

As mentioned above, the digits (130, 132) may be spaced evenly relative to each other in a plane parallel to the y-axis, thereby forming gaps 138 between the digits (130, 132). For example, the digits (130, 132) may be spaced so that there is a distance of 30 microns between each consecutively-located digit (ex.—a 30 micron-wide gap 138 between the consecutively-located digits). In further embodiments of the present invention, each of the digits (130, 132) are oriented parallel to each other. In current exemplary embodiments of the present invention, the gaps 138 formed by the spaced digits (130, 132) between the digits may be air-filled (ex.—may be at least substantially occupied by air). In alternative embodiments of the present invention, the gaps 138 formed by the spaced digits may be dielectric-loaded (ex.—may be at least substantially filled or occupied by a dielectric material).

In exemplary embodiments of the present invention, the capacitor 100 may further include a ground wall structure 140. In further embodiments of the present invention, the ground wall structure 140 may include a plurality of wall portions 142 which longitudinally extend parallel to the z-axis (ex.—perpendicular to the top surface 114 of the substrate 102). In still further embodiments of the present invention, said ground wall structure 140 may be configured at least partially around (ex.—may form an at least partial enclosure around) the backbone structures (106, 120) of the capacitor 100. As shown in FIG. 2, the backbone structures (106, 120) may extend longitudinally (ex.—in a plane perpendicular to the top surface 114 of the substrate 102) for a greater distance than the ground wall structure 140 such that said backbone structures (106, 120) protrude above the ground wall structure 140 as shown in FIG. 2.

In current exemplary embodiments of the present invention, the capacitor 100 may further include a plurality of pedestals 144, said pedestals 144 being configured for supporting the capacitor 100 upon the substrate 102. In further embodiments of the present invention, the pedestals 144 may be configured upon (exs.—formed upon or connected to) bottom surfaces (ex.—surfaces oriented toward the substrate 102) of each of: the backbone structures (106, 120), the digits (130, 132), and the ground wall structure 140. In further embodiments of the present invention, the pedestals 144 may be fabricated with a metal alloy. For example, in one or more embodiments, the backbone structures (106, 120) and protrusions (130, 132) may be formed of a pure metal, while the pedestals 144 may be formed of an alloy of the pure metal used to fabricate the backbone structures (106, 120) and protrusions (130, 132). In still further embodiments of the present invention the alloy of the pure metal would be chosen to limit the electrical conductivity of the pedestals 144.

In exemplary embodiments of the present invention, the ground wall portions 142 are spaced relative to the backbone structures (106, 120) in a plane parallel to the y-axis such that there are gaps 146 between the ground wall portions 142 and the backbone structures (106, 120). In further embodiments of the present invention, the degree of spacing (ex.—size or width of the gaps 146) between the backbone structures (106, 120) and the ground wall portions 142 may be selected for matching an impedance of a co-planar waveguide (CPW) which may be implemented with the capacitor 100. For instance, in exemplary embodiments of the present invention, the capacitor 100 may be configured for being connected to the co-planar waveguide (CPW) such that current may flow from the waveguide to the capacitor 100. In further embodiments of the present invention, the capacitor 100 may be configured so that a portion of said current which is supported along an edge of a ground plane in the co-planar waveguide may flow onto the ground wall structure 140 of the capacitor 100. In still further embodiments of the present invention, the ground wall structure 140 is configured with sufficient cross-section for ensuring low ohmic loss in the ground wall structure 140. In such manner as described above, the capacitor 100 provides a low impedance pass for CPW ground current, thereby promoting improved charge distribution (ex.—time-varying charge distribution) on the digits (130, 132) of the capacitor 100 and improved density (exs.—improved charge density, improved capacitance per unit area) for the capacitor 100 relative to currently available components which may be microfabricated in a metal deposition process which is distinct from a Metal-Insulator-Metal (MIM) process.

In further embodiments of the present invention, the digits (130, 132) of the capacitor 100 may be configured (ex.—sized) to have a height-to-width aspect ratio of at least 24:1 for promoting improved charge density of the capacitor 100. In still further embodiments of the present invention, the microfabricated RF capacitor 100 may be fabricated via process(es) which may be easily adaptable for using any one of a number of well-established integrated circuit (IC) fabrication techniques, thereby promoting high yield production and low cost production. During fabrication of said capacitor 100, the shape and size of the capacitor 100 may be strategically selected for maximizing charge density over the greatest possible area of the capacitor digits (130, 132) and promoting improved performance of the capacitor 100 over commercially available microfabricated components. In further embodiments of the present invention, the capacitor 100 may be fabricated implementing a highly conductive metal (ex.—gold) as the primary metal for fabricating the capacitor 100, thereby promoting improved environmental reliability.

As mentioned above, the capacitor 100 may be connected to the substrate 102 to form a microfabricated RF structure 200. In current exemplary embodiments of the present invention, the substrate 102 may be an insulating substrate 102 or a semi-insulating substrate 102. Further, said substrate 102 may have a metal layer 148 (ex.—a hard metal layer 148, such as a Titanium Tungsten alloy) formed over the substrate 102 (ex.—configured upon the top surface 114 of the substrate 102) for keeping the microfabricated RF structure 200 stable at large aspect ratio. The metal layer 148 on the substrate 102 may promote improved stability of the microfabricated RF structure 200 by selecting a metal layer 148 which has a similar coefficient of thermal expansion as the primary metal used in fabricating the capacitor 100.

In further embodiments of the present invention, the capacitor 100 may be configured for promoting improved power capability (ex.—high power capability) compared to currently available microfabricated components. For example, if gold is implemented as the primary metal in forming the capacitor 100, the thickness of the gold may be strategically selected for allowing the capacitor 100 to be fabricated onto a high thermal conductivity substrate 102, such as an aluminum nitride substrate 102. In further embodiments of the present invention, because the capacitor 100 may be configured as described above, said capacitor 100 may provide a larger metal footprint for promoting reduced thermal resistance to a heat sink compared to currently available ceramic components.

In further embodiments of the present invention, the capacitor 100 may be configured to facilitate the use of the capacitor in a multichip module with vertical signal interconnect. The multichip module may result in savings in cost and printed circuit board area of radio communications subsystem. RF signals in a multichip module may be represented by electrical currents that pass through via holes in an insulating or semi-insulating substrate. In further embodiments of the present invention, because the capacitor 100 may be configured on a multichip module as described above, said capacitor 100 may be fabricated on substrate material chosen for compatibility with laser drilling of high-aspect ratio via holes. For instance, the via holes (ex.—microvias) may have diameters of 150 microns or less. Some substrate materials which are well compatible with processing of microvias may include soda lime, Silicon, Alumina and optically translucent Sapphire.

In current exemplary embodiments of the present invention, the signal wirebond pads (104, 118) of the capacitor 100 may be configured for being connected (ex.—via wirebonds) to electrodes (ex.—RF signal electrodes) of the substrate 102 for receiving RF signals (ex.—current) from the electrodes. As mentioned above, the backbone structures (106, 120) and the digits (130, 132) may be connected to the signal wirebond pads (104, 118) and may be configured for distributing the current (ex.—charge) received from the electrodes and for promoting structural stability of the capacitor 100. In further embodiments of the present invention, the wirebond pads (104, 118) may form or may be part of an interconnect which is configured for connecting the capacitor 100 to a transmission line which may feed the capacitor. In still further embodiments of the present invention, the ground wall structure 140 may be configured for being (ex.—for providing or acting as) an extension of the transmission line, such that current supported along the edge of the ground plane in the coplanar waveguide (CPW) may flow into the ground wall structure 140. In further embodiments of the present invention a RF power transmission structure which transforms the impedance at the terminal section of a transmission structure such as hollow waveguide may be fabricated using the same fabrication process that builds the capacitor 100 in the present invention. In further embodiments of the present invention a microwave transmission structure which transforms the impedance at the terminal section of transmission structure such as coplanar waveguide on a Gallium Arsenide substrate may be fabricated using the same fabrication process that builds the capacitor 100 in the present invention.

In further embodiments of the present invention, the ground wall structure 140 (ex.—the transmission line extension) may be spaced apart from the backbone structure 106 in both an x-plane (ex.—a plane which is parallel to the x-axis) and a y-plane (ex.—a plane which is parallel to the y-axis). In still further embodiments of the present invention, the degree of spatial separation between the ground wall structure (ex.—the transmission line extension) and the backbone structure 106 may be strategically selected or established for minimizing reflections at the interconnect. Thus, the capacitor 100 of the exemplary embodiments of the present invention may allow for a custom interconnect to be provided between passive components, such that the design of said interconnect is not constrained by the standards for packaging, parts placement and wave soldering systems which burden chip-capacitor interconnects. Further, the capacitor 100 of the exemplary embodiments of the present invention may promote and/or enable miniaturization by providing a reduced device footprint and vertical integration. Further, the capacitor 100 of the exemplary embodiments of the present invention may promote a higher effective capacitor first self-resonant frequency than is obtained by the chip ceramic capacitor. In still further embodiments of the present invention, the capacitor 100, in combination with on-chip radio (OCR) coils may promote lower loss filtering than ceramic chip components.

In current exemplary embodiments of the present invention, the capacitor 100 and/or RF structure 200 may be implemented in various devices, such as in Quint Networking Technology Local Oscillation (QNT LO) rejection filters, Tactical Targeting Network Technology Local Oscillation (TTNT LO) rejection filters, Global Positioning System (GPS) diplexers, GPS filtering systems, NavStrike devices and/or Ground Mobile Radio (GMR) devices. In further embodiments of the present invention, the capacitor 100 may be configured for providing a low RF loss component at frequency regimes including but not limited to Ultra-High Frequency (UHF) and higher frequencies.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A capacitor, comprising:
   a first signal wirebond pad and a second signal wirebond pad, the wirebond pads each configured for being connected to an electrical current source;
   a first backbone structure and a second backbone structure, the first backbone structure being connected to the first signal wirebond pad, the second backbone structure being connected to the second signal wirebond pad, the backbone structures being configured for receiving electrical current from the electrical current source via the wirebond pads, each backbone structure including a first backbone portion and a second backbone portion;
   a plurality of protrusions, said plurality of protrusions being connected to the backbone portions of the backbone structures, said protrusions being configured for distributing current received by the backbone structures and for promoting structural stability of the capacitor; and
   a ground wall structure, the ground wall structure configured for being connected to a ground current source, the ground wall structure further configured for receiving ground current from the ground current source.

2. A capacitor as claimed in claim 1, wherein each protrusion included in the plurality of protrusions is a wall-shaped protrusion.

3. A capacitor as claimed in claim 2, wherein a first protrusion included in the plurality of protrusions is connected to the first backbone structure and extends toward the second backbone structure, while a second protrusion included in the plurality of protrusions is connected to the second backbone structure and extends toward the first backbone structure.

4. A capacitor as claimed in claim 3, wherein the first protrusion is configured in a parallel orientation relative to the second protrusion, thereby forming a gap between the first protrusion and the second protrusion.

5. A capacitor as claimed in claim 4, wherein the gap is at least substantially filled by air.

6. A capacitor as claimed in claim 4, wherein the gap is at least substantially filled by a dielectric substance.

7. A capacitor as claimed in claim 4, wherein the gap separates the first protrusion from the second protrusion by a distance of 30 microns.

8. A capacitor as claimed in claim 4, wherein the first protrusion connects to an inner wall surface of one of the backbone portions of the first backbone structure at a forty-five degree angle relative to the inner wall surface of the backbone portion of the first backbone structure.

9. A capacitor as claimed in claim 8, wherein the second protrusion connects to an inner wall surface of one of the backbone portions of the second backbone structure at a forty-five degree angle relative to the inner wall surface of the backbone portion of the second backbone structure.

10. A capacitor as claimed in claim 4, wherein the first backbone portion of the first backbone structure and the second backbone portion of the first backbone structure each connect to the first signal wirebond pad at a 45 degree angle relative to a plane, said plane being both parallel to a z-axis and perpendicular to a top surface of the first wirebond pad.

11. A capacitor as claimed in claim 10, wherein the first backbone portion of the second backbone structure and the second backbone portion of the second backbone structure each connect to the second signal wirebond pad at a 45 degree angle relative to a plane, said plane being both parallel to a z-axis and perpendicular to a top surface of the second wirebond pad.

12. A capacitor as claimed in claim 4, wherein a height-to-width aspect ratio for each digit included in the plurality of digits is at least twenty-four-to-one (24:1) for promoting charge density of the capacitor.

13. A microfabricated Radio Frequency (RF) structure, comprising:
a substrate; and
a capacitor, said capacitor being connected to a surface of said substrate, said capacitor including:
a first signal wirebond pad and a second signal wirebond pad, the wirebond pads each configured for being connected to an electrical current source;
a first backbone structure and a second backbone structure, the first backbone structure being connected to the first signal wirebond pad, the second backbone structure being connected to the second signal wirebond pad, the backbone structures being configured for receiving electrical current from the electrical current source via the wirebond pads, each backbone structure including a first backbone portion and a second backbone portion;
a plurality of protrusions, said plurality of protrusions being connected to the backbone portions of the backbone structures, said protrusions being configured for distributing current received by the backbone structures and for promoting structural stability of the capacitor; and
a ground wall structure, the ground wall structure configured for being connected to a ground current source, the ground wall structure further configured for receiving ground current from the ground current source.

14. A microfabricated RF structure as claimed in claim 13, wherein the capacitor further includes a plurality of pedestals, said plurality of pedestals being connected to the first backbone structure, the second backbone structure, the plurality of protrusions and the ground wall structure, said pedestals being configured for supporting the capacitor upon the substrate.

15. A microfabricated RF structure as claimed in claim 13, wherein the surface of said substrate is formed of at least one of: aluminum nitride, soda lime, silicon, alumina, and optically translucent sapphire.

16. A microfabricated RF structure as claimed in claim 15, wherein the capacitor is formed of gold.

17. A microfabricated RF structure as claimed in claim 13, wherein the ground wall structure is spaced apart from the backbone structures by a non-zero distance in a plane parallel to the surface of the substrate.

18. A microfabricated RF structure as claimed in claim 13, wherein the microfabricated RF structure is a multichip module including a vertical signal interconnect, said substrate of the microfabricated RF structure including a plurality of microvias.

19. A capacitor, comprising:
a first signal wirebond pad and a second signal wirebond pad, the wirebond pads each configured for being connected to an electrical current source;
a first backbone structure and a second backbone structure, the first backbone structure being connected to the first signal wirebond pad, the second backbone structure being connected to the second signal wirebond pad, the backbone structures being configured for receiving electrical current from the electrical current source via the wirebond pads, each backbone structure including a first backbone portion and a second backbone portion;
a plurality of wall-shaped protrusions, said plurality of protrusions being connected to the backbone portions of the backbone structures, said protrusions being configured for distributing current received by the backbone structures and for promoting structural stability of the capacitor, a first protrusion included in the plurality of protrusions is connected to the first backbone structure and extends toward the second backbone structure, while a second protrusion included in the plurality of protrusions is connected to the second backbone structure and extends toward the first backbone structure, the first protrusion being configured in a parallel orientation relative to the second protrusion, thereby forming a gap between the first protrusion and the second protrusion; and
a ground wall structure, the ground wall structure configured for being connected to a ground current source, the ground wall structure further configured for receiving ground current from the ground current source.

20. A capacitor as claimed in claim 19, wherein the gap is at least substantially filled by one of: air and a dielectric substance.

* * * * *